United States Patent
Li et al.

(10) Patent No.: US 6,875,691 B2
(45) Date of Patent: Apr. 5, 2005

(54) TEMPERATURE CONTROL SEQUENCE OF ELECTROLESS PLATING BATHS

(75) Inventors: Nanhai Li, San Jose, CA (US); Nicolai Petrov, San Jose, CA (US); Artur Kolics, San Jose, CA (US)

(73) Assignee: Mattson Technology, Inc., Fremont, CA (US)

( * ) Notice: Subject to any disclaimer, the term of this patent is extended or adjusted under 35 U.S.C. 154(b) by 231 days.

(21) Appl. No.: 10/178,053

(22) Filed: Jun. 21, 2002

(65) Prior Publication Data

US 2003/0235983 A1 Dec. 25, 2003

(51) Int. Cl.$^7$ .............................................. H01L 21/44
(52) U.S. Cl. .................................... 438/678; 427/345
(58) Field of Search ........................... 438/678; 427/345

(56) References Cited

U.S. PATENT DOCUMENTS

| | | |
|---|---|---|
| 3,971,861 A | 7/1976 | de Waltoff |
| 4,171,393 A | 10/1979 | Donley et al. |
| 4,259,409 A | 3/1981 | Arnold |
| 4,554,184 A * | 11/1985 | Canestaro et al. .......... 427/345 |
| 4,659,587 A | 4/1987 | Imura et al. |
| 4,664,942 A | 5/1987 | Park |
| 4,701,351 A | 10/1987 | Jackson |
| 4,981,715 A | 1/1991 | Hirsch et al. |
| 5,077,085 A | 12/1991 | Schnur et al. |
| 5,079,600 A | 1/1992 | Schnur et al. |
| 5,130,081 A | 7/1992 | Niedrach |
| 5,230,928 A | 7/1993 | Takagi et al. |
| 5,292,558 A | 3/1994 | Heller et al. |
| 5,500,315 A | 3/1996 | Calvert et al. |
| 5,510,216 A | 4/1996 | Calabrese et al. |
| 5,674,787 A | 10/1997 | Zhao et al. |
| 5,695,810 A | 12/1997 | Dubin et al. |
| 5,814,197 A | 9/1998 | Batchelder et al. |
| 5,824,599 A | 10/1998 | Schacham-Diamand et al. |
| 5,830,805 A | 11/1998 | Shacham-Diamand |
| 5,846,598 A | 12/1998 | Semkow et al. |
| 5,869,134 A | 2/1999 | Reddy et al. |
| 5,891,513 A | 4/1999 | Dubin et al. |
| 5,935,652 A | 8/1999 | Angelopoulos et al. |
| 5,993,892 A | 11/1999 | Wasserman et al. |
| 5,997,997 A | 12/1999 | Angelopoulos et al. |
| 6,221,440 B1 | 4/2001 | Meyer et al. |
| 6,271,060 B1 | 8/2001 | Zandman et al. |
| 6,277,669 B1 | 8/2001 | Kung et al. |
| 6,287,894 B1 | 9/2001 | Sawin |
| 6,319,554 B1 | 11/2001 | Natarajan et al. |
| 6,348,240 B1 | 2/2002 | Calvert et al. |
| 2001/0024691 A1 * | 9/2001 | Kimura et al. .............. 427/346 |
| 2003/0092261 A1 * | 5/2003 | Kondo et al. ............... 438/638 |

OTHER PUBLICATIONS

"Electrochemically deposited thin film alloys for ULSI and MEMS applications", Microelectric Engineering 50 (2000), Y. Shacham–Diamand, Y. Sverdlov, pp. 525–531.

* cited by examiner

*Primary Examiner*—Lynne A. Gurley
(74) *Attorney, Agent, or Firm*—Dority & Manning, P.A.

(57) ABSTRACT

A sequence of temperature control in electroless plating for microelectronic processing is disclosed in this invention. This sequence improves the uniformity of the deposit, increases the lifetime of the plating bath and is cost effective. The plating bath is heated to a temperature, which is lower than the minimum deposition temperature, in an apparatus outside the plating chamber. Then the solution is introduced into the plating chamber without the occurrence of the deposition. After the chamber is filled, the solution is heated up to the desired deposition temperature. The deposition is initialized. After the deposition, the solution is returned back to the original tank.

34 Claims, 6 Drawing Sheets

TEMPERATURE CONTROL SEQUENCE OF ELECTROLESS PLATING BATHS

BACKGROUND OF THE INVENTION

Electroless plating refers to the autocatalytic or chemical reduction of aqueous metal ions to metal atoms on a substrate without application of an electrical current. Electroless plating processes and compositions are found in a wide variety of commercial practices and are used for plating a substantial number of metals and alloys onto various substrates. Examples of materials commonly plated through this process can include copper, nickel, gold, cobalt, tin-lead alloys, etc. The substrate surface can be any surface that is either catalytically active itself or can be activated by a catalyst. Possible substrates common in the past include, for example, metal, diamond, and a variety of polymers. Plating processes can be either selective, i.e., only a portion of the substrate surface is catalytically activated to control precisely where metal deposition will occur, or alternatively can be used to coat an entire substrate surface.

Electroless plating has been widely used in the microelectronics industry for deposition of layers on semiconductor wafers. For example, electroless plating has been used in the past to form adhesion, barrier and capping layers on substrates. For the purposes of this disclosure, a barrier layer is defined as a layer formed on at least a portion of a substrate surface which can prevent contact between the materials located on either side of the barrier layer. For example, a barrier layer can prevent oxidation or otherwise render passive the material covered by the barrier layer, or alternatively can prevent the material contained in a layer located on one side of the barrier layer from diffusing into a layer located on the other side of the barrier layer. For instance, in the microelectronics industry, Co(W)P and NiP are examples of two barrier layers used in the past for the prevention of copper ion diffusion into the substrate as well as for copper passivation.

Electroless plating processes known in the past generally include heating a bath solution to a certain deposition temperature, which generally corresponds to at least the minimum deposition temperature (i.e. the minimum temperature where deposition from that bath to that substrate can occur). After heating, the bath solution is pumped into a plating chamber. In the plating chamber, a substrate having an activated surface is present and the electroless plating begins at or near the time the hot solution contacts the substrate.

The plating process itself includes an induction period followed by a steady-state deposition period. The induction period is the time necessary to reach the mixed potential at which the steady-state metal deposition occurs. The deposition is usually designed to occur in a certain pH and temperature range. In a certain range, the deposition rate is proportional to the bath temperature. As such, most electroless plating processes heat the bath to the highest deposition temperature possible to take advantage of the higher deposition rate and increase process throughput. Bath temperature is one of the most important factors affecting the deposition rate of the layer. In addition to the deposition rate, however, bath temperature can also affect the uniformity and composition of the deposit and hence its properties. As such, temperature control of the electroless plating bath continues to be very important in these processes.

In addition to high throughput, uniformity of the deposit formed on the substrate is greatly desired. In the past, the bath solution has been introduced into the plating chamber via a rotating showerhead which has a slit opening or holes. Because the temperature of the bath is high, the induction period is short, and the deposition can start essentially upon contact of the solution with the substrate surface. This spray method can significantly affect the uniformity of the deposit formed on the substrate, however, due to, among other factors, the flow pattern of the bath solution as it is fed into the chamber. In addition, uniformity of the deposit can be affected by distribution of temperature on the wafer surface itself as the deposit is formed.

Prior art methods of electroless plating have proven problematic in many aspects. For example, a suitable showerhead design has proven very difficult for obtaining high quality products. Variation in head opening shapes and sizes, head rotation speed, and flow rate can cause different flow patterns across the substrate surface and affect deposition uniformity. For instance, one region of the substrate can have greater exposure to the high temperature bath solution and subsequently can have more material deposited at those regions. The design of the showerhead has thus been very important in an attempt to obtain even distribution of the solution.

In addition, the high temperature of the bath itself has often been disadvantageous in these processes. For example, loss of water from the bath due to evaporation can cause a change of concentration of the components and consequent change in deposition rate. In order to avoid this, the composition of the bath solution must be closely monitored and water must be frequently replenished. Additionally, reducing agents used in baths will often experience accelerated decomposition at high temperature, thus the lifetime of the bath solution can be shortened due to the high bath temperature. Moreover, in the processes of the past, a large volume of solution is usually held at high temperature and recirculated through the system for each subsequent plating operation. Such systems can demand high energy inputs and create high operating expenses.

Prior art processes also often require a long preparation time prior to deposition. Usually the tank size for the bath solution is 10 gallons or larger for industrial use. Such a tank size requires a long period of time for heating the solution from room temperature to deposition temperature. In addition, after the process is finished and the heater is shut down, the solution will often be circulated for a long period of time until cooled sufficiently to avoid excess bath decomposition.

As such, there is a need for an improved electroless plating process which can provide high quality, uniform deposition on a substrate at a high level of throughput, as well as increase bath lifetime and decrease energy requirements of the system.

SUMMARY OF THE INVENTION

In general, the present invention is directed to an electroless plating method which includes a temperature control sequence for the bath solution which is used in the plating process. More specifically, in one embodiment the present invention comprises conveying an electroless plating bath solution from a holding tank to a plating chamber, wherein the electroless plating bath solution is at a temperature less than but relatively close to the minimum deposition temperature of the bath solution. Once in the plating chamber, the bath solution can be heated to the deposition temperature and electroless deposition can take place.

Any suitable electroless plating bath solution can be used in the process of the present invention. In general, an electroless plating bath solution can comprise one or more sources of metal ion, a reducing agent, and a complexing agent. For instance, in one embodiment the source of metal ions can be cobalt sulfate and sodium tungstate. In an alternative embodiment, nickel chloride and nickel sulfate can be the metal ion sources. One example of a possible reducing agent can be sodium hypophosphate. One example of a possible complexing agent in the electroless plating bath solution can be sodium citrate. After filling the holding tank, at least a portion of the bath solution can then be removed from the holding tank, optionally preheated and moved into a plating chamber while at a temperature less than the minimum deposition temperature of the bath.

Once in the plating chamber, where the solution contacts at least a portion of a substrate, the bath solution can be further heated to a deposition temperature, at which time electroless deposition can occur and the desired deposit can form on the substrate. In one embodiment, the deposition temperature can be between about 60° C. and about 90° C. More specifically, the deposition temperature can be between about 70° C. and about 75° C. At lower deposition temperatures, preheating of the bath solution may not be necessary. If desired, the bath solution can be returned to the holding tank after the electroless deposition and the solution can be cooled and recycled.

When preheating of the solution is desired, the bath solution can be preheated to a temperature such that the temperature of the solution filling the plating chamber can be less than the minimum deposition temperature of the bath solution. For example, the bath solution can be preheated to a temperature less than about 10° C. below the minimum deposition temperature of the bath solution. More specifically, the bath solution can be preheated to a temperature between about 5° C. and about 10° C. below the minimum deposition temperature of the bath solution. In one embodiment, the bath solution can be preheated to a temperature of between about 50° C. and about 55° C. prior to charging it to the plating chamber.

In one embodiment, the entire holding tank of bath solution can be preheated in the holding tank itself prior to transferring the solution to the plating chamber. Alternative, only a portion of the bath solution can be removed from the larger holding tank and then preheated prior to charging the plating chamber with the portion of the bath solution. For instance, less than about 25% of the total volume of bath solution can be removed from the holding tank and preheated and particularly less than about 15% of the total amount of bath solution can be removed from the holding tank and preheated. In one embodiment, less than about 10% of the total amount of the bath solution can be removed from the holding tank and preheated.

The bath solution can be preheated prior to entering the plating chamber by any suitable method. For instance, the bath solution can be preheated in a separate pre-heat tank or alternatively in a heated line as it flows from the holding tank to the plating chamber.

The layer formed on the substrate through the process of the present invention can be any type of layer. For instance, the layer can cover the entire surface of the substrate or alternatively can cover only a portion of the substrate, as in a pattern. The layer can also be any desired thickness. Specifically the layer can be less than about 200 Å thick. More specifically, the layer can be between about 50 Å and about 100 Å thick.

In one embodiment, the substrate which can have the electroless plating layer deposited upon it can be a semi-conductor wafer. For example, the deposit on the wafer can be a barrier layer which can act as a passivation layer for a copper layer already applied to the wafer.

Other features and aspects of the present invention are discussed in greater detail below.

BRIEF DESCRIPTION OF THE INVENTION

A full and enabling disclosure of the present invention, including the best mode thereof, directed to one of ordinary skill in the art, is set forth more particularly in the remainder of the specification, which makes reference to the appended figures in which.

Figure 1:
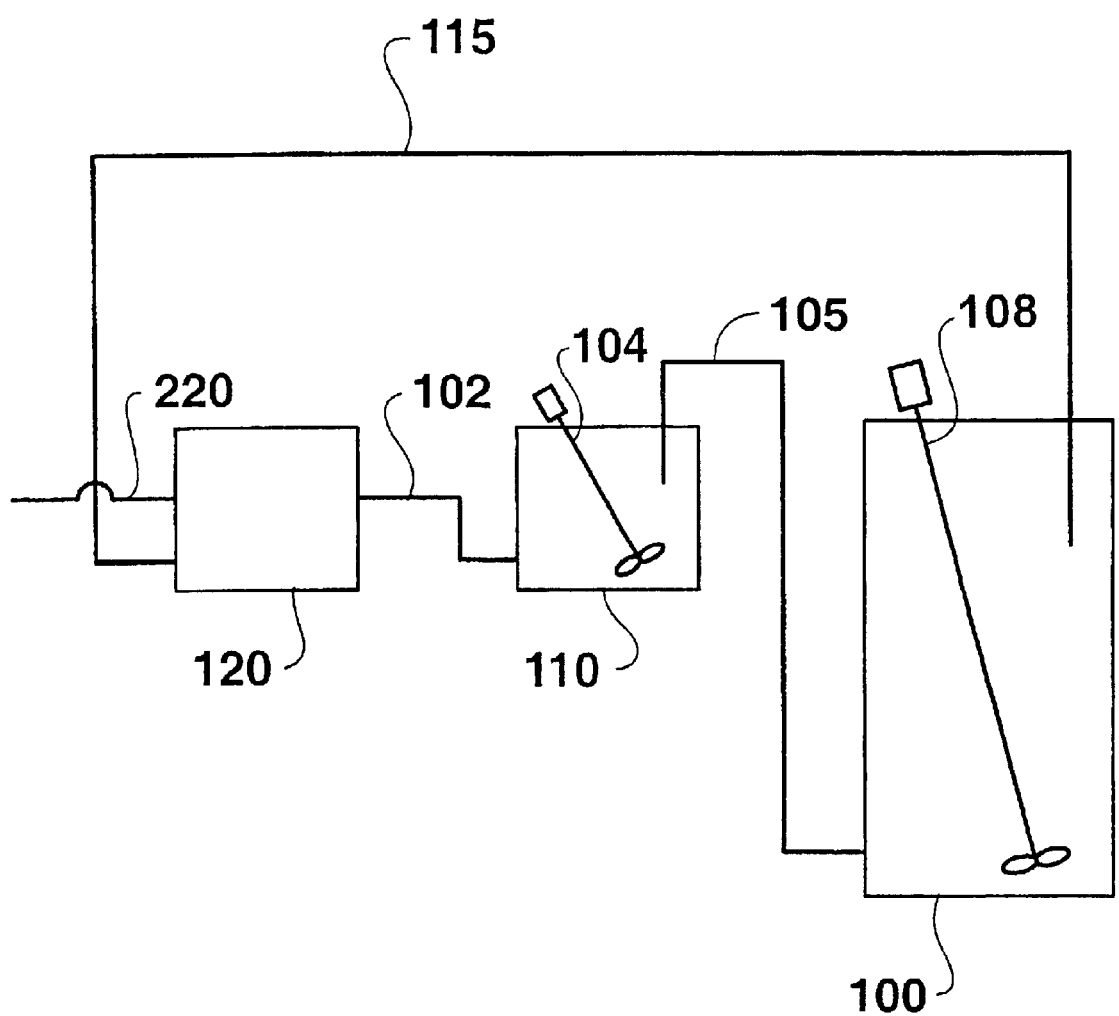
FIG. 1 illustrates one embodiment of the flow sequence for the electroless plating bath solution of the present invention.

Repeat use of references characters in the present specification and drawings is intended to represent same or analogous features or elements of the invention.

DETAILED DESCRIPTION OF PREFERRED EMBODIMENTS

It is to be understood by one of ordinary skill in the art that the present discussion is a description of exemplary embodiments only, and is not intended as limiting the broader aspects of the present invention which broader aspects are embodied in the exemplary construction.

Electroless plating provides a method of forming a layer on at least a portion of a substrate surface without the application of an electrical current. The present invention provides an electroless plating method with improved uniformity of deposition while decreasing the energy requirements of the system and increasing the life of the electroless plating bath solution.

In general, the method of the present invention comprises introducing a temperature control sequence to an electroless plating bath solution in any electroless deposition process which takes place at higher than ambient temperature. More specifically, the present invention comprises introducing the electroless plating bath solution to the plating chamber at a temperature below the minimum deposition temperature, and then, only after the plating chamber has been filled, heating the bath solution in the plating chamber to a deposition temperature at which electroless deposition can occur and the deposit can form on the substrate. If desired, the process of the present invention can also include preheating the bath solution prior to charging the plating chamber. For example, the bath solution can be heated to a temperature slightly below the minimum deposition temperature prior to charging the solution to the plating chamber.

In one embodiment of the present invention, rather than charging all of the bath solution from the holding tank to the plating chamber, only a portion of the bath solution can be taken from the larger holding tank and charged to a small plating chamber. In this embodiment, the smaller portion of the bath solution can be heated to a temperature somewhat less than the minimum deposition temperature of the solution prior to filling the plating chamber.

The plating chamber can already contain the substrate to be processed when the bath solution is introduced. After the bath solution has been introduced into the plating chamber, the solution is then heated to the deposition temperature which is at least equal to the minimum deposition temperature of the solution and may be somewhat higher. The solution is held at or near the deposition temperature for a suitable amount of time such that electroless deposition occurs and a layer is formed on the substrate surface where desired. After the desired deposition time, the bath solution can be removed from the plating chamber and returned to the holding tank.

The process of the present invention can provide many improvements over heated electroless plating processes known in the past. For example, uniformity of deposition problems found in past processes due to filling the plating chamber with a bath solution which is already at or above the deposition temperature can be eliminated. Additionally, in some embodiments of the present invention, only a small portion of the total bath solution is heated at any one time, so the energy requirements of the system can be low. Moreover, by heating the bath solution only during the deposition process and immediately cooling the solution again by circulating it back into the larger, cooler holding tank, the effective life of the bath solution can be extended since thermal decomposition of the bath components can be minimized. Other advantages of the present invention are numerous and will become apparent throughout the remainder of this disclosure.

The methods of the present invention are suitable for use with any desired electroless plating process which can be used to deposit a layer onto a substrate at an elevated temperature. For instance, the present invention is suitable for either acid or alkaline electroless plating bath solutions. In general, electroless plating solutions include one or more sources of metal ions, a reducing agent, a complexing agent, and/or any other desired constituents, such as, for example, stabilizers, pH adjusters, salts, etc. which can be used to obtain the desired plating characteristics of the bath. Such solutions have been known and utilized in the past in many different industries, including, for example, the microelectronics industry.

In one embodiment, electroless plating solutions can be used in the process of the present invention which deposit layers, such as adhesion, barrier and capping layers on semiconductor wafers at an elevated temperature. For example, an electroless plating solution can be formed which can be used to deposit a metal phosphide barrier layer on a substrate, such as a semiconductor wafer, at an elevated temperature. For instance, a metal phosphide barrier layer can be plated on top of a previously formed copper layer on a substrate to prevent oxidation of the copper. Alternatively, a metal phosphide barrier layer can be plated on a substrate to prevent ions from one layer, such as a subsequently formed layer, from diffusing down into layers or the substrate material itself below the barrier layer.

One embodiment of an electroless plating bath solution suitable for use in the process of the present invention is a solution which can be used to deposit a cobalt-tungsten-phosphorous alloy barrier layer on a semiconductor wafer. One possible electroless plating bath solution for such an embodiment can include, for example, between about 0.03M and about 0.1M cobalt sulfate, between about 0.01M and about 0.1M sodium tungstate, between about 0.1M and about 0.5M reducing agent such as sodium hypophosphate, between about 0.1M and about 1M complexing agent such as sodium citrate, and any other desired additives such as, for example, a combination of boric acid ($H_3BO_3$), potassium hydroxide (KOH), and a surfactant such as RE610 available from the Rhodia Corporation. For example, the electroless plating bath solution can contain between about 0.1M and about 1.0M boric acid and between about 0.01 g/l and about 0.05 g/l surfactant. In one embodiment, the bath solution can be formed with a pH of between about 9 and about 9.5.

In an alternative embodiment, an electroless plating bath solution can be formed which can be used in the process of the present invention to deposit a nickel phosphide layer on a substrate. In this embodiment, the plating bath can be similar to the solution discussed above, but can be formed with nickel chloride ($NiCl_2$) and nickel sulfate ($NiSO_4$) as the metal ion sources.

In accordance with the present invention, once formed, the electroless plating bath solution can be charged to the plating chamber at a temperature which is less than the minimum deposition temperature of the solution. In general, the electroless plating solution can enter the plating chamber at a temperature which is no more than about 10° C. less than the desired deposition temperature. After filling the plating chamber, the bath solution can then be heated to the deposition temperature such that electroless deposition occurs and a deposit is formed on the substrate. The bath solution can then be removed from the plating chamber, and the process can be repeated.

The bath solution can be charged to the plating chamber at ambient temperature. In an alternative embodiment, however, the bath solution can be preheated. In general, whether the bath solution is preheated depends mostly on the desired deposition temperature. For example, if the deposition temperature is within 10° C. of the ambient temperature, no preheating may be required. Otherwise, for most applications, the electroless plating bath solution is preheated prior to being charged to the plating chamber.

One embodiment of a possible flow sequence for an electroless plating bath solution utilized in the present invention is illustrated in FIG. 1. In this embodiment, the process of the present invention includes charging a holding tank 100 with a bath solution. The amount of solution charged to the holding tank 100 can be any desired amount and can depend upon individual process conditions. For example, in one embodiment, about ten gallons of a bath solution can be formed and charged to holding tank 100, although other embodiments of the invention can include holding tanks which can accommodate smaller or larger volumes of the bath solution. If desired, holding tank 100 can be sealed to prevent contamination of the solution such as through a nitrogen purge (not shown). Holding tank 100 can also include, if desired, an agitator 108, to keep the bath well mixed in the tank. In this particular embodiment, the bath solution in the holding tank 100 can generally be at ambient temperature or can even be cooled somewhat so as to prolong the life of the bath solution.

In the embodiment illustrated in FIG. 1, rather than using the entire bath contents in the plating chamber, a portion of the bath solution can be removed from the holding tank 100 and conveyed to a plating chamber 120. The portion of the bath solution removed from holding tank 100 can, in general, be less than about 25% of the total bath. Specifically, the portion of the bath solution removed from the holding tank can be less than about 15% of the total bath. More specifically, less than about 10% of the total bath can be removed from the holding tank 100.

After removal from the holding tank 100, the bath solution can be pre-heated to a temperature such that the bath solution can be charged to the plating chamber 120 at a temperature which is only slightly less than the minimum deposition temperature of the solution. For example, in one embodiment the bath solution can be charged to the plating chamber 120 at a temperature less than about 10° C. below the minimum deposition temperature of the solution. More specifically, the bath solution can be charged to the plating chamber 120 at a temperature between about 5° C. and about 10° C. below the minimum deposition temperature of the bath solution.

In one embodiment, as illustrated in FIG. 1, a portion of the bath solution can be removed from tank 100 via line 105 to a smaller pre-heat tank 110. Pre-heat tank 110, if desired, can include an agitator 104 and can be sealed, such as through a nitrogen purge, to avoid contamination. The bath solution can be pre-heated in pre-heat tank 110 by any suitable method. For example, in one embodiment, pre-heat tank 110 can include a heating plate which can be immersed into the solution and then used to heat the solution. Alternatively, the solution can be heated from the bottom of the tank by use of a heated tank base. Any suitable heating method can be utilized to pre-heat the bath solution. After pre-heating, the bath solution can be moved from pre-heat tank 110 to plating chamber 120 through line 102.

Figure 3:
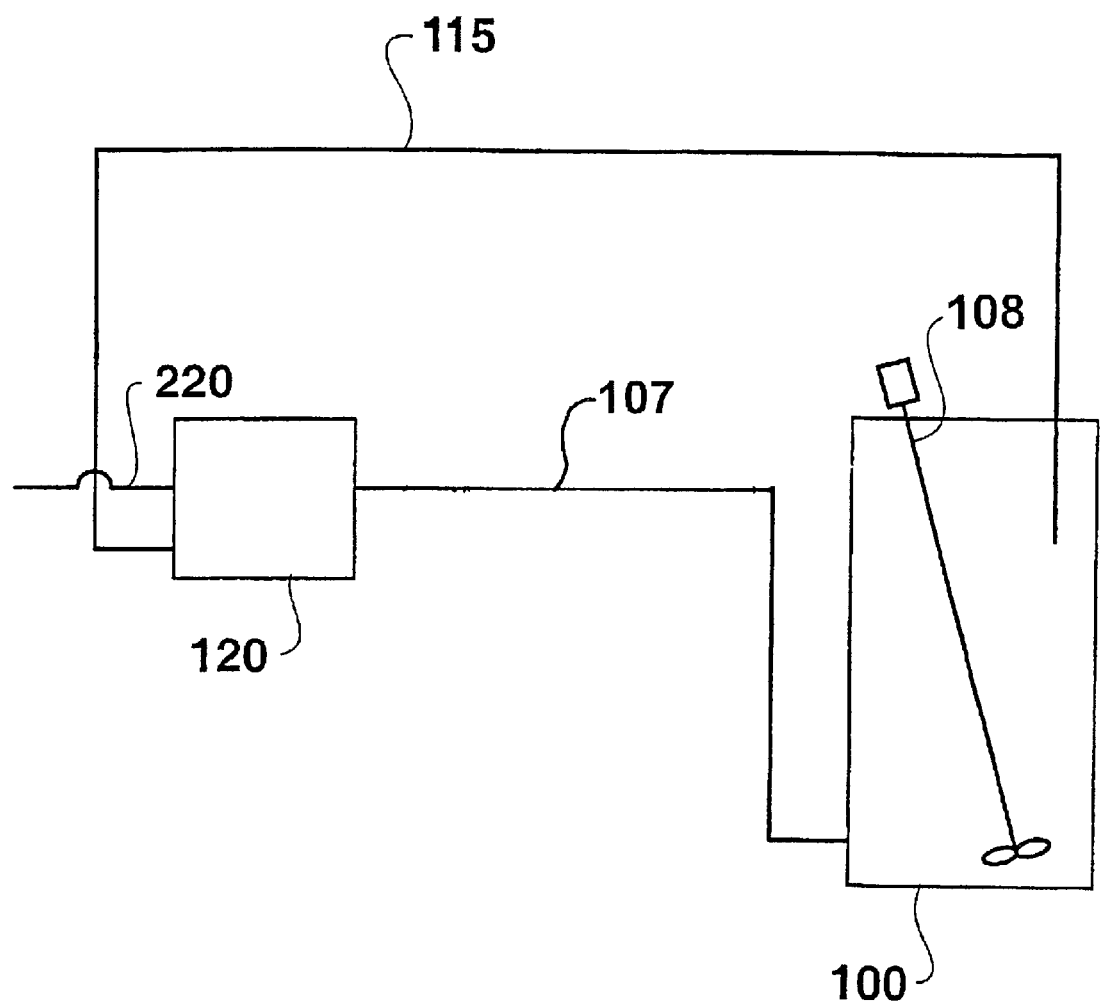
FIG. 3 illustrates another embodiment of the flow sequence for the electroless plating bath solution of the present invention.

In an alternative embodiment of the present invention, such as that illustrated in FIG. 3, rather than pre-heating the bath solution in pre-heating tank 110, the bath solution can be pre-heated in a heated line 107. In this embodiment, heated line 107 can be heated by any suitable method known in the art and can carry the bath solution from holding tank 100 to plating chamber 120. As the solution moves through heated line 107 it can be heated to the desired pre-heat temperature by the time it reaches plating chamber 120.

It should be understood that though FIGS. 1 and 3 illustrate embodiments of the invention wherein the plating chamber is smaller than the holding tank and only a portion of the entire contents of the bath solution is moved from the holding tank to the plating chamber at one time, the methods discussed in these embodiments are equally applicable to those embodiments wherein the entire contents of the holding tank are moved to the plating chamber at one time for processing one or more wafers in-a plating chamber roughly equivalent in size to the holding tank.

In yet another alternative embodiment of the present invention, the bath solution can be charged to the plating chamber with no intermediate preheating of the solution at all, such as when it is shown to be more cost effective to heat the bath solution to the deposition temperature in only one step in the plating chamber rather than in two separate heating steps. For example, in one embodiment of the present invention, the minimum deposition temperature of the bath solution can be quite low, such as, for example, between about 5° C. and about 10° C. above the ambient temperature. In such an embodiment, it may be preferable to not pre-heat the bath solution, since it is already close to the minimum deposition temperature. In this case, the bath solution can flow directly from the holding tank 100 to the plating chamber 120 with no intermediate pre-heating.

Figure 2A:
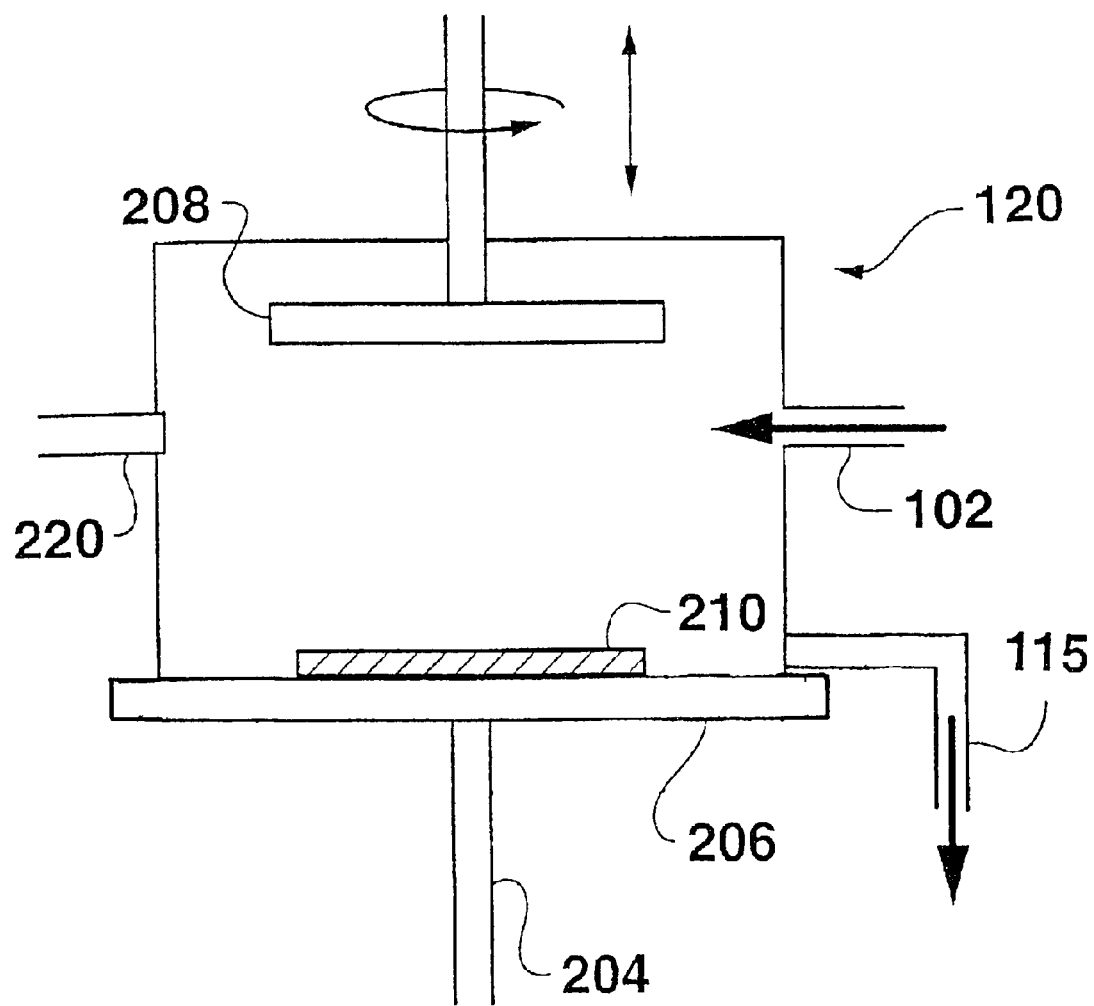
FIG. 2A illustrates one embodiment of the plating chamber of the present invention when the chamber is closed.

Once the bath solution has been pre-heated, as desired, it can be transferred to the plating chamber 120. One possible embodiment of plating chamber 120 is illustrated in FIG. 2A. In general, plating chamber 120 can be about the same size as pre-heating tank 110. Plating chamber 120 includes a substrate holder 206, held on an arm 204 for holding a substrate 210, such as a semiconductor wafer. The plating chamber 120 can also include a gas inlet 220, which can allow an inert gas such as nitrogen or argon to enter the plating chamber when sealed to help protect the wafer 210 from possible contamination. Although illustrated with only a single substrate 210, substrate holder 206 can also be designed to hold multiple substrates.

Figure 2B:
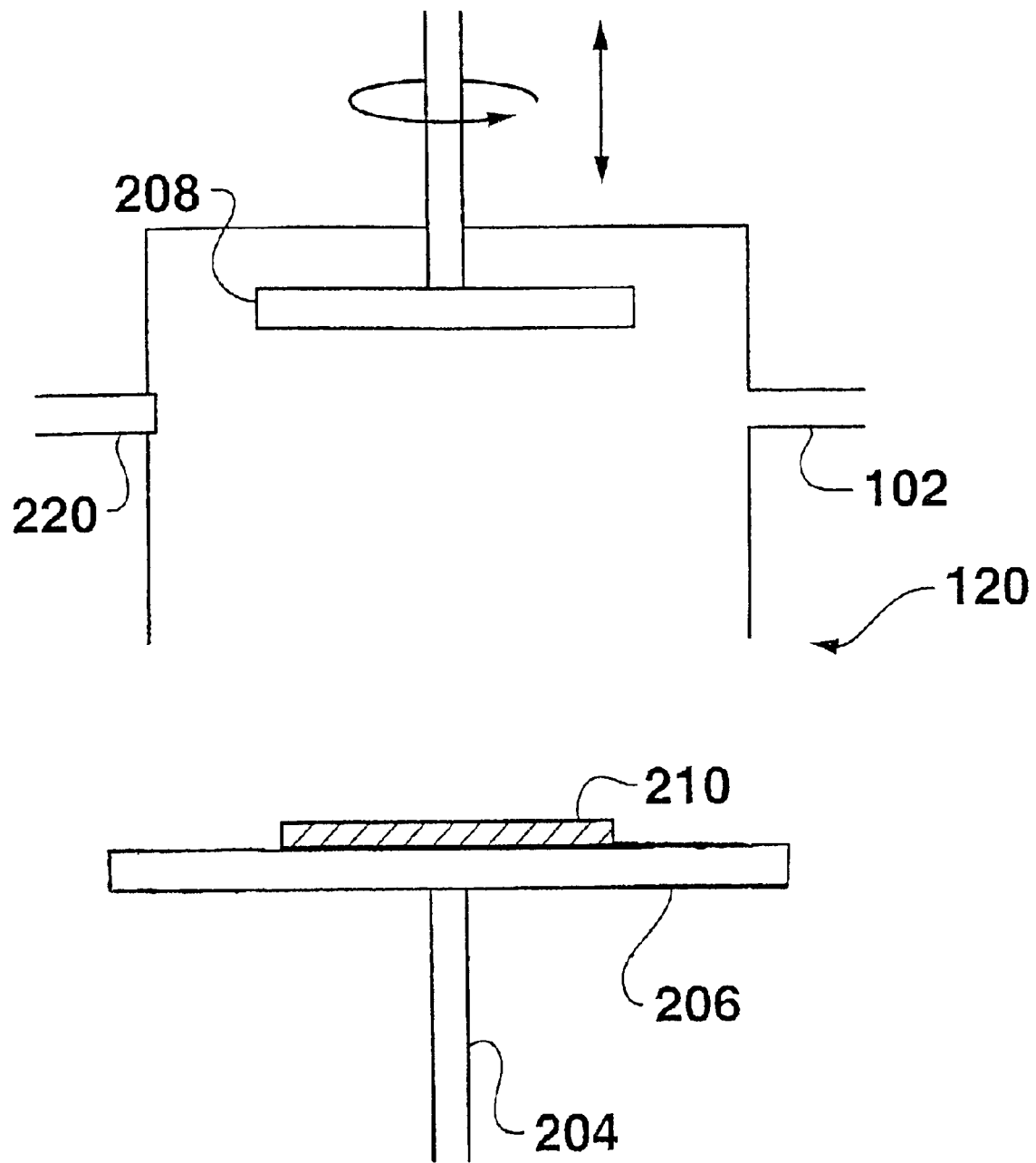
FIG. 2B illustrates the plating chamber of FIG. 2A when open, as when a substrate is being loaded into the chamber for processing.

The substrate 210 will generally be placed into the plating chamber 120 prior to filling the plating chamber with the bath solution. FIG. 2B illustrates one method of loading the substrate 210 into the plating chamber 120. In this embodiment, arm 204 can retract with a piston action, lowering substrate holder 206 below the base level of chamber 120 such that substrate 210 can be loaded onto substrate holder 206. Once loaded, arm 204 can move up into the closed position, sealing substrate holder 206 against the sides of the chamber 120 and closing the chamber. The chamber can then be purged of any possible contaminants prior to filling with the bath solution via line 102.

Figure 4A:
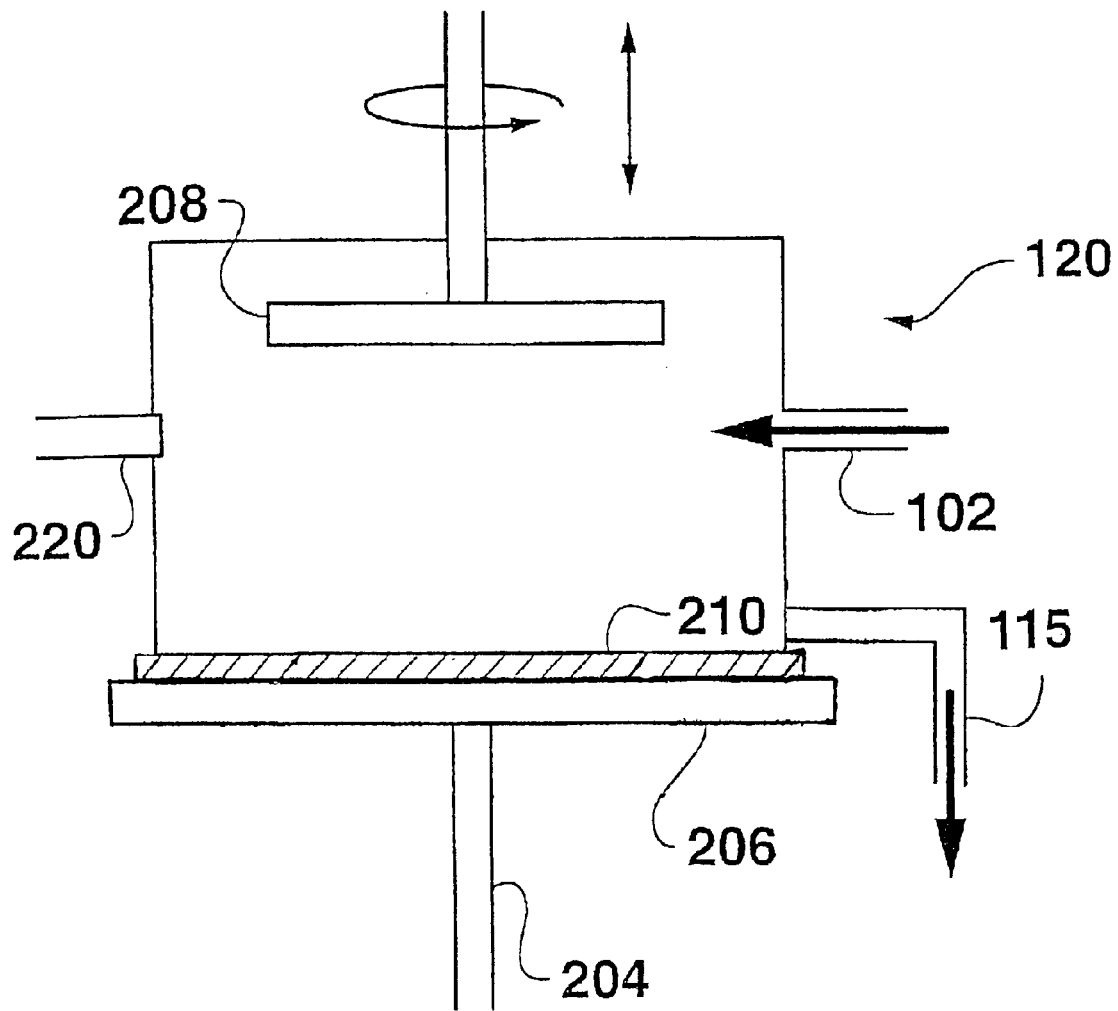
FIG. 4A illustrates another embodiment of the plating chamber of the present invention when the chamber is closed.
Figure 4B:
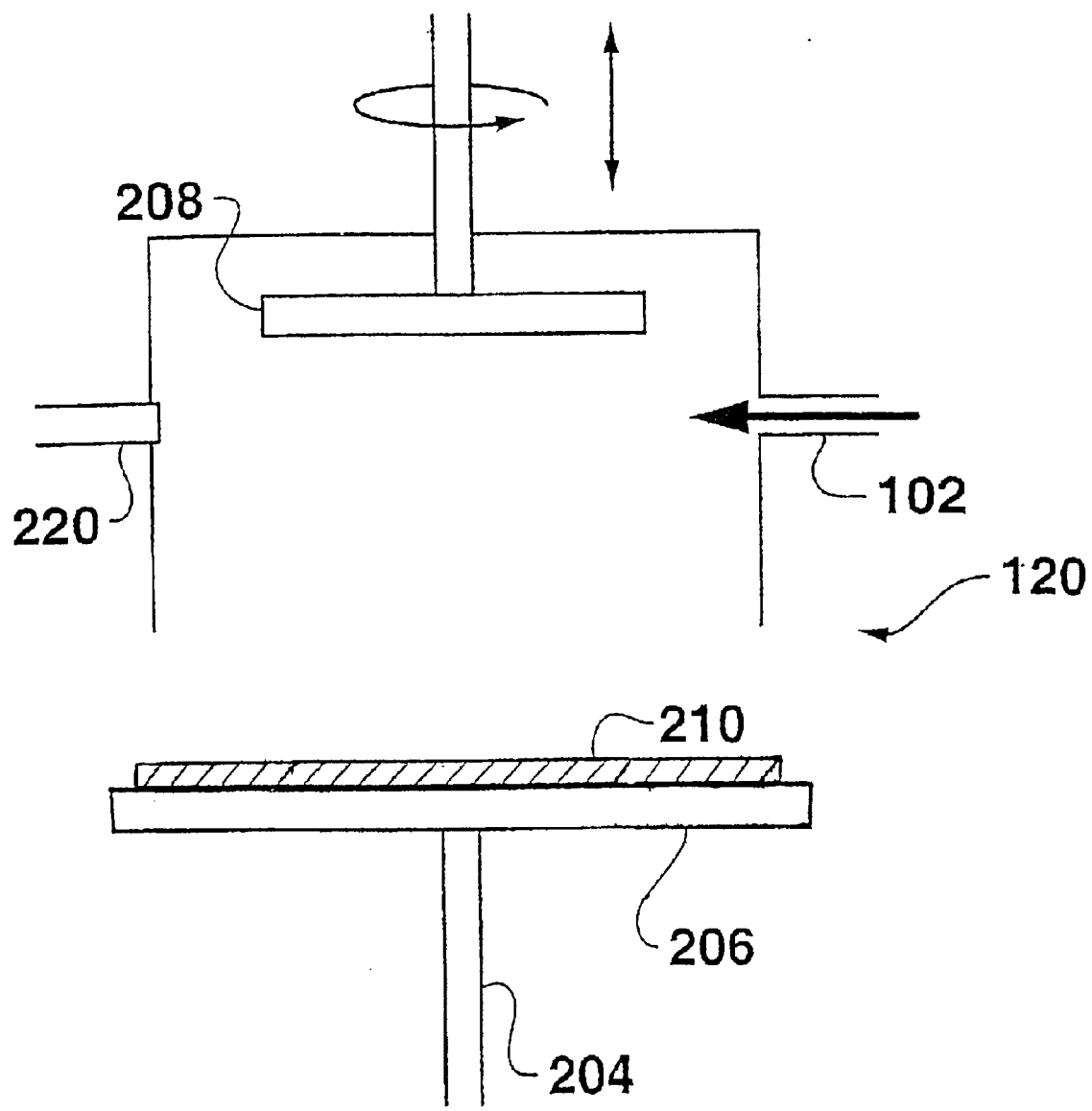
FIG. 4B illustrates the plating chamber of FIG. 4A when open, as when a substrate is being loaded into the chamber.

In an alternative embodiment of the plating chamber, as shown in FIGS. 4A and 4B, the substrate 210 can have a diameter slightly greater than the diameter of the chamber 120. In this embodiment, the substrate can be loaded onto substrate holder 206 when the chamber is open, as shown in FIG. 4B and similar to the embodiment shown in FIG. 2B. When arm 204 moves up into the closed chamber position in this embodiment, the substrate 210 itself can contact the sides of chamber 120 and form a seal with the chamber walls, thereby closing the chamber, as shown in FIG. 4A. Such an embodiment may be utilized to minimize contact between the back side of the wafer and the plating bath solution.

Substrate 210 can be any desired substrate and can have a surface of any suitable material. For example, substrate 210 can include a metal, diamond, or polymer material on the surface of the substrate which can be coated by the process of the present invention. In one embodiment, substrate 210 can be a silicon based substrate such as those used in forming semiconductor devices. Additionally, the substrate can be previously coated with one or more materials prior to being subjected to the process of the present invention.

The surface of the substrate can be either naturally catalytically active or can be activated by a catalyst in order that the metal ions in the bath solution can deposit on the substrate surface at the deposition temperature as desired. In one embodiment, palladium can be used as the surface catalyst, though other suitable catalysts are well known in the art and could also be used. In addition, the electroless plating process can be either selective, i.e., only a portion of the substrate surface is catalytically activated to control precisely where metal deposition will occur, or alternatively can be used to coat the entire surface of the substrate.

The amount of the bath solution which can be charged to the plating chamber can depend on the size of the plating chamber, which, in turn, can depend on the size and number of substrates to be processed at a single time. In one embodiment, the plating chamber can be large, and the contents of the entire holding tank 100 can be charged to the plating chamber 120. Alternatively, the plating chamber can be quite small, and only a portion of the bath solution can be removed from the holding tank and charged to the plating chamber. For example, in one embodiment, a 200 mm wafer can be processed in a plating chamber similar to that illustrated in FIG. 2A using a volume of bath solution of about 1.5 liters. In another embodiment, a 300 mm wafer can be processed in a larger plating chamber using a volume of bath solution of about 3.5 liters. As the pre-heated bath solution enters plating chamber 120 through line 102, it can fill plating chamber 120 to a point such that the top surface of wafer 210 is submerged and is somewhat below the surface of the bath solution.

The bath solution can be charged to the plating chamber by any suitable means. For example, line 102 can simply empty into plating chamber 120 with no specific pressure or flow fittings required. No deposition will occur as the plating chamber is being filled in the present invention since the bath solution is not at the minimum deposition temperature when it is charged to the plating chamber and first contacts the substrate. Therefore, the flow pattern of the bath solution over the substrate as the chamber is filled can have little or no effect on the subsequent electroless deposition and a more uniform deposition can be attained by the methods of the present invention.

After the bath solution has filled the plating chamber 120, the bath solution can be heated to the deposition temperature. For example, in one embodiment, heating plate 208 can be lowered into the bath solution to heat the solution. While the bath solution is being heated, heating plate 208 can also be rotated in the solution such that the solution is kept well mixed and heat distribution through the solution can be improved. In general, the depth of the bath solution over the substrate should be enough that the heating plate 208 can contact and heat the solution without coming into contact with the substrate 210.

The solution can be heated in the plating chamber such as by heating plate 208 to a deposition temperature which is at least equal to the minimum deposition temperature of the bath solution. If desired, however, the solution can be heated to a temperature somewhat higher than the minimum deposition temperature, in order to increase the deposition rate of the process. In any event, the deposition temperature of the solution should not exceed temperatures which could cause the bath solution to become unstable and begin to decompose.

Once the desired deposition temperature is reached, heating plate 208 can be withdrawn from the bath solution. If desired, heating plate 208 can be rotated while held above the bath solution, to allow bath solution adhering to heating plate 208 to fall back into the bath. At or near the time the deposition temperature is reached by the bath solution, electroless deposition can begin. Because the bath solution is evenly distributed across the substrate surface prior to the onset of electroless deposition, the methods of the present invention can greatly enhance uniformity of the deposit formed on the substrate.

A temperature control process can be used to monitor the temperature of the bath solution in the plating chamber so that if the bath temperature drops below some preset minimum the heating plate 208 can again be lowered into the bath solution and the solution can be reheated to the deposition temperature.

In one embodiment of the present invention, a metal phosphide barrier layer can be plated onto a substrate using a bath solution such as that discussed above. In such an embodiment, the minimum deposition temperature of the solution can be about 60° C., and the deposition temperature of the bath solution can be anywhere between about 60° C. and about 90° C., at which point the solution can become unstable. While deposition can occur at the minimum deposition temperature, the process can be slow, with an induction period of up to about five minutes prior to reaching steady-state metal deposition. As such, it may be desirable to heat the bath solution to a higher deposition temperature, for example, between about 70° C. and about 75° C. In this temperature range, induction period can be very short, and deposition can begin almost immediately once the bath solution reaches the deposition temperature.

The amount of time the substrate can be held in the heated bath solution can depend upon many factors, including, for example, desired film thickness. In general, any desired film thickness can be formed by the methods of the present invention. For instance, a film thickness of less than about 200 Å can be formed by the methods of the present invention. More specifically, a layer of between about 50 Å and about 100 Å thick can be formed by the methods of the present invention.

In general, the steady state deposition period of the process of the present invention can be less than about 10 minutes. Specifically, steady state deposition period can be less than about 5 minutes. More specifically, steady state deposition period can be less than about 3 minutes.

In one embodiment of the invention, a metal-phosphide layer can be formed on the substrate surface, and the bath solution can be heated to a deposition temperature of between about 70° C. and about 75° C. In such an embodiment, a deposition layer of between about 50 Å and 100 Å can be formed on at least a portion of the substrate surface with a steady state deposition period of less than about 2 minutes. More specifically, in such an embodiment, a metal-phosphide deposition layer of between about 50 Å and 100 Å can be formed with a steady state deposition period of about 1 minute.

Referring again to FIG. 1, after deposition has occurred, the bath solution can be removed from the plating chamber 120 via line 115 and returned to holding tank 100. The holding tank will generally be at a temperature lower than the temperature of the bath solution coming from the plating chamber 120. Therefore, as the bath solution is returned to the holding tank 100 the bath solution temperature will drop. For instance, when only a portion of the total bath solution has been used in the plating chamber 120, the returning bath solution can mix with the larger volume of cooler solution in the holding tank and quickly drop in temperature. Similarly, if all of the bath solution has been transferred to the plating chamber in the process, the bath solution can drop in temperature when transferred back to the empty holding tank. By maintaining the bath solution at low temperature for as much of the process as possible, high temperature decomposition of bath solution constituents can be avoided. This can prolong the effective lifetime of the bath solution. In addition, by quickly lowering the temperature of the bath solution used in the plating chamber, water evaporation from the system can be minimized, and the need for water replenishment to the bath solution can be greatly decreased and in some embodiments, eliminated altogether.

If desired, the process of the present invention can be a continuous process which can rapidly process a number of substrates. For example, in one embodiment, only a portion of the total amount of the bath solution in the holding tank can be charged to the plating chamber. In this embodiment, after the plating chamber is filled with the bath solution, a second portion of bath solution can be removed from the holding tank. If desired, this second portion can be preheated in the time that the first portion of bath solution is being heated to the deposition temperature and the electroless deposition is occurring in the plating chamber. Thus, as soon as the first deposition process is complete and the plating chamber is emptied of bath solution, the processed substrate can be removed from the plating chamber and a second, unprocessed substrate can be inserted. When the second substrate is in place, the second portion of bath solution can fill the plating chamber and the second substrate can be plated. Thus, a fast, continuous electroless plating process can be established.

These and other modifications and variations to the present invention may be practiced by those of ordinary skill in the art, without departing from the spirit and scope of the present invention, which is more particularly set forth in the appended claims. In addition, it should be understood that aspects of the various embodiments may be interchanged both in whole or in part. Furthermore, those of ordinary skill in the art will appreciate that the foregoing description is by way of example only, and is not intended to limit the invention so further described in such appended claims.

What is claimed is:

1. An electroless plating method comprising:
   providing an electroless plating bath solution in a holding tank;
   removing at least a portion of said electroless plating bath solution from said holding tank;
   providing a plating chamber;
   locating a substrate within the plating chamber;
   filling the plating chamber with the electroless plating bath solution that has been removed from the holding tank, said bath solution contacting at least a portion of a the substrate upon filling said plating chamber, wherein said bath solution filling said plating chamber is at a first temperature which is less than the minimum deposition temperature of said bath solution;
   holding the bath solution which has filled the plating chamber in the plating chamber;
   heating said bath solution held in said plating chamber to a deposition temperature which is at least equal to the minimum deposition temperature of said bath solution;
   forming a deposit on at least a portion of said substrate by electroless deposition in the plating chamber while the bath solution which has been removed from the holding tank is held in the plating chamber; and
   removing the bath solution which has filled the plating chamber from the plating chamber following the formation of a deposit on at least a portion of the substrate.

2. The method of claim 1, further comprising returning said bath solution from said plating chamber to said holding tank after the bath solution has been removed from the plating chamber.

3. The method of claim 1, further comprising pre-heating said bath solution in said holding tank to said first temperature.

4. The method of claim 1, further comprising pre-heating said bath solution which has been removed from the holding tank to said first temperature prior to introducing said bath solution into said plating chamber.

5. The method of claim 4, wherein said bath solution which has been removed from said holding tank is heated to said first temperature in a pre-heat tank.

6. The method of claim 4, wherein said bath solution which has been removed from said holding tank is heated to said first temperature in a heated line.

7. The method of claim 1, wherein said first temperature is less than about 10° C. below the minimum deposition temperature of said bath solution.

8. The method of claim 1, wherein said first temperature is between about 5° C. and about 10° C. below the minimum deposition temperature of said bath solution.

9. The method of claim 1, wherein the bath solution which has been removed from said holding tank is less than about 25% of the total amount of the bath solution.

10. The method of claim 1, wherein the bath solution which has been removed from the holding tank is less than about 15% of the total amount of the bath solution.

11. The method of claim 1, wherein the bath solution which has been removed from the holding tank is less than about 10% of the total amount of the bath solution.

12. The method of claim 1, wherein said substrate is a semiconductor wafer.

13. The method of claim 1, wherein said deposit is formed on said substrate in a pattern.

14. The method of claim 1, wherein an entire surface of said substrate is covered by said deposit.

15. The method of claim 1, wherein said deposit is less than about 200 Å thick.

16. The method of claim 1, wherein said deposition temperature is between about 60° C. and about 90° C.

17. A method of forming a barrier layer on a substrate comprising:
   providing an electroless plating bath solution in a holding tank;
   removing a portion of said electroless plating bath solution from said holding tank;
   heating said bath solution portion to a first temperature, wherein said first temperature is less than the minimum deposition temperature of said electroless plating bath solution;
   providing a plating chamber;
   locating a substrate within the plating chamber;
   filling the plating chamber with said bath solution portion such that said bath solution portion is held in the plating chamber and contacts at least a portion of the substrate upon completion of said filling step;
   heating said bath solution portion held in said plating chamber to a deposition temperature which is at least equal to the minimum deposition temperature of said bath solution;
   depositing a barrier layer on at least a portion of said substrate by electroless deposition in the plating chamber while the bath solution portion is held in the plating chamber; and
   removing said bath solution portion from said plating chamber after the barrier layer is formed.

18. The method of claim 17, wherein said bath solution portion is heated to said first temperature in a pre-heat tank.

19. The method of claim 17, wherein said bath solution portion is heated to said first temperature in a heated line.

20. The method of claim 17, wherein said first temperature is less than about 10° C. below the minimum deposition temperature of said bath solution.

21. The method of claim 17, wherein said first temperature is between about 5° C. and about 10° C. below the minimum deposition temperature of said bath solution.

22. The method of claim 17, wherein said bath solution portion is less than about 15% of the total amount of said bath solution.

23. The method of claim 17, wherein said bath solution portion is less than about 10% of the total amount of said bath solution.

24. The method of claim 17, wherein said substrate is a semiconductor wafer.

25. The method of claim 24, wherein said semiconductor wafer comprises a copper layer.

26. The method of claim 17, wherein said barrier layer is less than about 200 Å thick.

27. The method of claim 17, wherein said barrier layer is between about 50 Å and about 100 Å thick.

28. The method of claim 17, wherein said deposition temperature is between about 60° C. and about 90° C.

29. The method of claim 17, wherein said deposition temperature is between about 70° C. and about 75° C.

30. A method of forming a metal phosphide barrier layer on semiconductor wafer comprising:

providing an electroless plating bath solution in a holding tank, wherein said electroless plating bath solution comprises a metal ion source, a reducing agent, and a complexing agent;

removing less than about 15% of said electroless plating bath solution from said holding tank;

heating said bath solution which has been removed from said holding tank to a first temperature which is less than the minimum deposition temperature of said bath solution;

providing a plating chamber;

locating a semiconductor wafer within the plating chamber;

filling the plating chamber with the bath solution which has been removed from the holding tank and subsequently heated such that said heated bath solution is held in the plating chamber and contacts at least a portion of the semiconductor wafer upon completion of said filling process;

heating said bath solution held in said plating chamber to a deposition temperature between about 60° C. and about 90° C.;

depositing a barrier layer on at least a portion of said semiconductor wafer by electroless deposition in the plating chamber while the heated bath solution is held in the plating chamber; and removing said bath solution which filled said plating chamber from said plating chamber following deposition of the barrier layer and returning said bath solution which filled said plating chamber to said holding tank, wherein the temperature of said bath solution removed from said plating chamber decreases upon return to said holding tank.

31. The method of claim 30, wherein said electroless plating bath solution comprises;

a) a metal ion source selected from the group consisting of cobalt sulfate, sodium tungstate, and mixtures thereof;

b) a reducing agent comprising sodium hypophosphate; and c) a complexing agent comprising sodium citrate.

32. The method of claim 30, wherein said electroless plating bath solution comprises:

a) a metal ion source selected from the group consisting of nickel chloride, nickel sulfate, and mixtures thereof;

b) a reducing agent comprising sodium hypophosphate; and c) a complexing agent comprising sodium citrate.

33. The method of claim 30, wherein said deposition temperature is between about 70° C. and about 75° C.

34. The method of claim 30, wherein said first temperature is between about 50° C. and about 55° C.

* * * * *